United States Patent [19]

Kirch

[11] 4,055,515

[45] Oct. 25, 1977

[54] DEVELOPER FOR PRINTING PLATES

[75] Inventor: John Nicholas Kirch, Blue Ash, Ohio

[73] Assignee: Borden, Inc., Columbus, Ohio

[21] Appl. No.: 645,704

[22] Filed: Dec. 31, 1975

[51] Int. Cl.² .......................... C11D 7/50; G03C 5/24; C11D 7/32

[52] U.S. Cl. .................................... 252/542; 96/35.1; 134/38; 134/42; 252/170; 252/364; 252/544

[58] Field of Search ............... 252/170, 171, 542, 544, 252/364; 134/38, 42; 96/35.1, 48 R

[56] References Cited

U.S. PATENT DOCUMENTS

| | | | |
|---|---|---|---|
| 3,623,870 | 11/1971 | Curran et al. | 96/35.1 X |
| 3,673,099 | 6/1972 | Corby et al. | 134/38 X |
| 3,764,384 | 10/1973 | Berni | 134/38 X |
| 3,806,460 | 4/1974 | Mukai et al. | 252/542 X |
| 3,891,438 | 6/1975 | Katz et al. | 96/48 R X |

OTHER PUBLICATIONS

Chiu et al., IBM Technical Disclosure Bulletin, vol. 18, No. 2, July 1975, p. 395.

*Primary Examiner*—Harris A. Pitlick
*Attorney, Agent, or Firm*—George A. Kap; George P. Maskas; Daniel D. Mast

[57] ABSTRACT

This composition includes 50 to 85% by weight water, 10 to 25% relatively non-volatile inert organic solvent, 0.1 to 5% of a medium foamer detergent and 5 to 15% of a N-alkyl-2-pyrrolidone lubricant.

9 Claims, No Drawings

DEVELOPER FOR PRINTING PLATES

This invention relates to a developer composition which is applied to an exposed coated printing plate in order to remove the unexposed coating material. The developer has other kindred applications such as on printed circuit boards, integrated circuits and decorative arts where regions of a coating composition are polymerized by means of light or other means and it is desired to remove the unpolymerized or unexposed coating composition.

The developer described herein is especially suited for use in connection with negative working printing plates for offset printing which have a photopolymerizable coating thereon. In a negative working printing plate, the light affected areas are hardened and remain as the resist or stencil after development of the plate, as compared to positive working printing plates where these areas are washed out during development.

The active components of the coating on printing plates include 20 to 50% weight percent saturated halogenated polyester, 10 to 45% organic polyacrylate, 5 to 15% metal acrylate and an effective amount of a photoinitiator.

The halogenated polyester of the coating composition is a reaction product of a halogenated benzene dicarboxylic acid or its anhydride with polymerized styrene-allyl alcohol or a polyol containing 2 to 4 reactive hydroxyl groups and 2 to 6 carbon atoms per molecule. The alkylene moiety of the alkylene polyols contains 2 to 6 carbon atoms. The reaction is carried out by reacting one equivalent of the acid or its anhydride with about one equivalent of the polyol. Examples of suitable acids or anhydrides are tetrachlorophthalic anhydride, dichlorophthalic anhydride as well as the halogenated, preferably chlorinated, isophthalic and terephthalic acids and anhydrides. As to polyols, examples of these include glycerol, diethylene glycol, tetraethylene glycol, propylene glycol, pentaerythritol, dipentaerythritol, and polymeric styrene-allyl alcohols such as RJ-100 and RJ-101 resins sold by Monsanto.

The organic polyacrylates contain 2 to 5 acrylate groups and are acrylic esters of polyols. The polyols contain 2 to 6 hydroxyl groups and 4 to 10 carbon atoms per molecule. Examples of the organic polyacrylates include hexanediol diacrylate, neopentylglycol diacrylate and dipentaerythritol monohydroxypentaacrylate.

The catalysts for the photoreaction of the saturated halogenated polyesters noted above, are metal acrylates, preferably divalent metal acrylates such as zinc and calcium diacrylates. Zinc diacrylate in white powder form of 325 mesh particle size and 88% purity, is preferred since it was found to impart ink receptivity and picture intensity to the composition.

The photoinitiator constituent of the coating composition is selected from the known organic photoninitators, especially the substituted lower alkyl anthraquinones such as $C_1$ to $C_5$ alkyl anthraquinones including 2-methyl anthraquinone and 2-ethyl anthraquinone.

A small amount of a dye may also be included in the coating composition to impart color contrast thereto. For photopolymerizable coating composition described above, the dye must be excitable by actinic light. Rhodamine 6GDN dye in amounts of 0.05 to 0.3%, serves the purpose eminently.

The developer composition described herein includes the following components on weight basis:

water: 50 to 85%
organic solvent: 10 to 25%
lubricant: 5 to 15%
detergent: 0.1 to 5%.

The solvent is a relatively non-volatile inert organic solvent such as $C_1$ to $C_6$ alkyl alcohols which include isopropyl alcohol and ethyl alcohol, as well as such solvents as Cellosolve (R) and derivatives thereof such as methyl Cellosolve, Cellosolve acetate, butyl Cellosolve. These solvents are relatively nonvolatile when compared with such volatile solvents as benzene, toluene and xylene. the purpose of the solvents is to soften the unexposed coating on the plate so that it can be removed easily.

The lubricant is selected from the class of pyrrolidones and more specifically from N-$C_1$ to $C_4$ alkyl-2-pyrrolidones. Examples of the lubricants include N-methyl-2-pyrrolidone and N-vinyl-2-pyrrolidone. The N-methyl-2-pyrrolidone is preferred since it is stable, biodegradable, of low odor, non-toxic, relatively inexpensive, and is an excellent solvent for resinous materials and many organic and inorganic compounds.

The detergent employed in the developer functions to wet and to lubricate the unexposed photopolymerizable coating composition to facilitate its removal. Suitable detergents are nonionic, anionic and cationic of the mild variety such as ADS-100 sold by Mona Industries of Paterson, N.J. The ADS-100 detergent is a reaction product of mixed fatty acids and diethyl amine in respective mol ratio of 2:1 having acid number of 45 to 50, alkali number of 115 to 125, specific gravity at 20° C of 1.00, no flash point in an open cup and pH of a 10% aqueous solution thereof of 9.5. This is an anionic-nonionic detergent.

To control foaming, about 1% of a defoamer can be added to the developer compositon especially when the developer is to be used in automatic plate processor.

The developer composition removes the unpolymerized coating composition on a printing plate or the like and also gives a clean metal surface to facilitate the determination of whether complete development has been achieved. This would be evident from amount and character of debris remaining on the printing plate.

EXAMPLE I — PREPARATION OF PRINTING PLATE

Part A of the negative plate coating included the following components, on weight basis:

Cellosolve: 30.00%
Cellosolve acetate: 22.25
Rhodamine: 0.10
zinc diacrylate: 7.40
2-ethyl anthraquinone: 5.00
paraffin oil: 0.25
polyester resin: 35.00.

The polyester resin was prepared by mixing and heating at 190° F 37.3 parts by weight glycerol (1,2,3-propanetriol) 31.0 parts tetrachlorophthalic anhydride and 10.9 parts dimethyl propionic acid. Ater these components were dispersed to provide a homogeneous mass, 20.8 parts of trimellitic anhydride were added slowly to avoid undue foaming, following which, the mass was heated to 410° F and maintained at this temperature until a clear solid pill was obtained when a drop of the hot polyester was placed on a cold glass surface. The polyester was then cooled to 380° F and stored. Its acid number was 26/28.

Part A was prepared by mixing ingredients in a kady mill which was previously rinsed with Cellosolve after thorough cleaning. The dispersion temperature of the mill was not allowed to exceed 125° F. The dispersion was cooled to 100° F and packed into lined kits through organdy.

119 parts by weight of Part A were combined with 19 parts by weight of Part B, which was dipentaerythritol monohydroxypentaacrylate, to prepare the coating composition.

A plate measuring 24½ × 36¼ inches composed of 0.012 inches thick steel sheet with a 0.0001 inch thick copper coating was treated by roller coating the copper surface with the coating composition described above to a thickness of 5.5 grams per square meter. The coating was dried in a forced draft oven at 255° F for 6 minutes. A negative was applied to the coated plate and the plate was exposed to 220 volt carbon arc lamp at a distance of 48 inches for 6 minutes. The exposure can be also effected in 90 seconds at a distance of 18 inches using an Addulux lamp with a Rutherford PCM unit.

The unexposed areas on the plate were washed out by brushing onto the plate developer having the following composition on weight percent basis:

ADS-100 detergent: 2.0
Cellosolve acetate: 3.0
Cellosolve: 11.0
N-methyl-2-pyrrolidone: 10.0
water: 74.0.

Developing time for this plate was 1½ minutes with one application of the developer. Following the development step, the plate was rinsed with tap water, squeegeed off and a ferric chloride etch 46 Be solution was spread evenly over the plate for 1½ minutes before being removed with a squeegee. This was followed with a thorough rinse with tap water and a counter etch with 3% sulfuric acid solution. At this stage, the plate was ready for inking with any rub-up lithograhic ink for facilitating a check on reproduction, particularly in fine halftones. Borden's LS-147-N ink was used. After inking, the plate was rinsed again with tap water and then gummed with 10 to 14 Be gum arabic solution to protect steel areas.

This plate was used in a printing press and produced over 100,000 impressions on the coating and over 1,000,000 impressions on the copper surface. When this plate was removed, it was still capable of producing good print quality.

The developer composition described herein has several remarkable advantages. Since it is about three quarters water, it is very cheap in comparison to other developers used for the same purpose. It produces no scumming, meaning that no residual unexposed coating is left behind after the coating is treated with the developer composition. This particular developer also imparts a color contrast between the polymerized coating adhering to the plate and the copper surface of the plate by brightening the copper surface and making it cleaner and more reflective.

I claim:

1. Developer composition for developing an exposed photosensitive coating on a substrate to remove therefrom non-image areas comprising, on weight basis, 50 to 85% water; 10 to 25% relatively non-volatile solvent selected from $C_1$ to $C_6$ alkyl alcohols, Cellosolve, Cellosolve acetate, butyl Cellosolve, methyl Cellosolve, and mixtures thereof; 0.1 to 5% of a detergent selected from the group consisting of nonionic, anionic and cationic detergents of the mild variety; and 5 to 15% of a pyrrolidone lubricant.

2. Developer composition of claim 1 wherein the solvent is selected from Cellosolve, Cellosolve acetate, methyl Cellosolve and butyl Cellosolve and wherein the lubricant is N-methyl-2-pyrrolidone.

3. Developer composition of claim 2 wherein the detergent is a reaction product of mixed fatty acids and diethyl amine in a respective mol ratio of 2:1 having an acid number of 45 to 50, alkali member of 115 to 125, specific gravity at 20° C of 1.00, no flash unit in an open cup and a pH of a 10% aqueous solution thereof of 9.5.

4. Developer composition comprising, on weight basis, 74% water; 14% organic solvent selected from cellosolve and cellosolve acetate; 2% detergent selected from the group consisting of nonionic, anionic and cationic detergents of the mild variety; and 10% N-methyl-2-pyrrolidone.

5. Developer composition of claim 4 wherein the detergent is a reaction product of mixed fatty acids and diethyl amine in a respective mol ratio of 2:1 having an acid number of 45 to 50, alkali member of 115 to 125, specific gravity at 20° C of 1.00, no flash point in an open cup and a pH of a 10% aqueous solution thereof of 9.5.

6. Developer composition for developing on a substrate an exposed photosensitive coating containing halogenated polyester, organic polyacrylate, metal acrylate and a photoinitiator, said composition comprising 50 to 85% water; 10 to 25% relatively non-volatile solvent selected from $C_1$ to $C_6$ alkyl alcohols, Cellosolve, Cellosolve acetate, butyl Cellosolve, methyl Cellosolve and mixtures thereof; 0.1 to 5% of a detergent selected from the group consisting of nonionic, anionic and cationic detergents of the mild variety; and 5 to 15% of a pyrrilidone lubricant; said photosensitive coating is hardened on exposure to light to form an image in the clear areas of negative transparency through which light passes to cause a reaction in the lightsensitive coating although other areas remain unaffected where light is blocked and is thus prevented from affecting the light sensitive coating.

7. Developer composition of claim 6 wherein the lubricant is selected from N-$C_1$ to $C_4$ alkyl-2-pyrrolidones.

8. Developer composition of claim 7 wherein the photoinitiator in the coating is a lower alkyl anthraquinone, said developer comprising 74% water; 14% solvent selected from Cellosolve, Cellosolve acetate and mixtures thereof; 2% detergent which is a reaction product of mixed fatty acids and diethylene amine in a respective mol ratio of 2:1 having an acid number of 45 to 50, alkali member of 115 to 125, specific gravity at 20° C of 1.00, no flash point in an open cup and a pH of a 10% aqueous solution thereof of 9.5, known as ADS-100; and 10% N-methyl-2-pyrrolidone.

9. Developer composition of claim 8 including an effective amount of a defoamer to inhibit foaming of the developer.

* * * * *